(12) United States Patent
Stefanescu et al.

(10) Patent No.: US 6,600,557 B1
(45) Date of Patent: Jul. 29, 2003

(54) METHOD FOR THE DETECTION OF PROCESSING-INDUCED DEFECTS IN A SILICON WAFER

(75) Inventors: Anca Stefanescu, O'Fallon, MO (US); Zhijian Pei, Worcester, MA (US); Henry F. Erk, St. Louis, MO (US); Tom Doane, St. Charles, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 09/543,192

(22) Filed: Apr. 5, 2000

Related U.S. Application Data

(60) Provisional application No. 60/135,365, filed on May 21, 1999.

(51) Int. Cl.[7] .............................................. G01N 21/00
(52) U.S. Cl. .............................. 356/237.2; 356/237.1; 156/662; 438/16
(58) Field of Search .................... 356/237.1, 237.2, 356/237.3, 237.4, 237.5, 237.6; 438/8–16, 688, 756, 691, 665, 396, 398; 134/2–3, 21; 428/331, 336

(56) References Cited

U.S. PATENT DOCUMENTS

| | | | |
|---|---|---|---|
| 2,847,287 A | | 8/1958 | Landgren ........................ 41/42 |
| 4,238,275 A | * | 12/1980 | Shih ............................... 438/16 |
| 4,294,651 A | * | 10/1981 | Ohmura ........................... 438/14 |
| 4,380,490 A | | 4/1983 | Aspnes et al. ................. 156/662 |
| 4,874,463 A | * | 10/1989 | Koze et al. ..................... 438/16 |
| 4,903,717 A | | 2/1990 | Sumnitsch ..................... 134/99 |
| 5,340,437 A | | 8/1994 | Erk et al. ....................... 156/639 |
| 5,445,706 A | | 8/1995 | Okuno et al. ............... 156/637.1 |
| 5,593,505 A | | 1/1997 | Erk et al. ....................... 134/1.3 |
| 5,820,978 A | * | 10/1998 | Huang ............................ 428/331 |
| 5,851,924 A | * | 12/1998 | Nakazawa et al. ........... 438/691 |
| 6,107,201 A | * | 8/2000 | Lee ................................ 438/688 |
| 6,171,955 B1 | * | 1/2001 | Chen ............................. 438/665 |
| 6,319,331 B1 | * | 11/2001 | Kume et al. .................... 134/3 |

FOREIGN PATENT DOCUMENTS

| | | |
|---|---|---|
| EP | 281 115 | 9/1988 |
| EP | 588 055 A2 | 3/1994 |
| EP | 796 933 A2 | 9/1997 |
| JP | 57 035 315 | * 2/1982 |

OTHER PUBLICATIONS

"Chemical Etching of Silicon, I. The System HF, $HNO_3$, and $H_2O$", Harry Robbins and Bertram Schwartz, Jun. 1959, pp. 505–508, The Electrochemical Society.

"Chemical Etching of Silicon, II. The System HF, $HNO_3$, $H_2O$, and $HC_2H_3O_2$", H. Robbins and B. Schwartz, Feb. 1960, pp. 108–111, vol. 107, No. 2, The Electrochemical Society.

"Chemical Etching of Silicon, III. A Temperature Study in the Acid System", B. Schwartz and H. Robbins, Apr. 1961, pp. 365–372, vol. 108, No. 4, Journal of the Electrochemical Society.

"Inorganic and Theoretical Chemistry", J. W. Mellor, 1965, pp. 342–348, vol. XII, Treatise on Inorganic and Theoretical Chemistry.

(List continued on next page.)

Primary Examiner—Frank G. Font
Assistant Examiner—Sang H. Nguyen
(74) Attorney, Agent, or Firm—Senniger, Powers, Leavitt & Roedel

(57) ABSTRACT

A process for detecting mechanical and mechanochemical defects in the surface or edge of a silicon wafer resulting from a wafer manufacturing process. The present process comprises treating a surface of the silicon wafer with an aqueous etch solution comprising hydrofluoric acid and an oxidizing agent, followed by optical inspection of the treated wafer surface prior to subjecting that surface to conventional mechanical or mechanochemical polishing. The present process affords the means by which to more efficient identify wafers having such defects, thus reducing wafer manufacturing time and cost.

24 Claims, 13 Drawing Sheets

OTHER PUBLICATIONS

"Water Treatment," Chapter 3, "The Removal of Colour, Odour, and Taste from a Water", C. G. James, 1965, pp. 65–85, The Danier Press Ltd., Edinburgh.

"A novel, non–halogen–based chemical oscillator", Arpad Nagy and Ludovit Treindl, Mar. 1986, pp. 344–345, vol. 320, Nature.

"Design of a Permanganate Chemical Oscillator with Hydrogen Peroxide", Arpad Nagy and Ludovit Treindl, 1989, pp. 2807–2810, vol. 93, No. 7, The Journal of Physical Chemistry.

"Chemical Etching of Silicon[1], IV. Etching Technology", B. Schwartz and H. Robbins, Dec. 1976, pp. 1903–1909, vol. 123, No. 12, J. Electrochem. Soc.

"An Examination of the Chemical Staining of Silicon", D. G. Schimmel and M. J. Elkind, Jan. 1997, pp. 152–155, J. Electrochem Soc.

"Formation mechanism of stains during Si etching reaction in HF–oxidizing agent–$H_2O$ solutions", Kee Suk Nahm, Young Hun Seo, and Hyung Jae Lee, Mar. 1997, pp. 2418–2424, vol. 81, No. 5, J. Appl. Phys.

* cited by examiner

METHOD FOR THE DETECTION OF PROCESSING-INDUCED DEFECTS IN A SILICON WAFER

CROSS-REFERENCE TO RELATED APPLICATIONS

This application claims the benefit of U.S. Provisional Application No. 60/135,365, filed May 21, 1999.

BACKGROUND OF THE INVENTION

The method of the present invention generally relates to the detection of defects in a semiconductor wafer. More particularly, the present invention relates to an inspection method for detecting defects in a silicon wafer resulting from the mechanical and mechanochemical steps the silicon wafer is subjected to in a common manufacturing process.

Semiconductor wafers, such as silicon wafers, are obtained from a single crystal silicon ingot by first slicing the ingot in a direction normal to its axis, typically by means of a wire saw or internal diameter saw. This process damages the surface of the wafer, often to a depth of about 80 microns or more. In addition, sawing or slicing the ingot in way this create ridges on the wafer surface, particularly when a wire saw is employed, resulting in there being a "waviness" to the surface. Through stringent process control waviness can be minimized, but it cannot be eliminated.

In order to remove the surface damage caused by sawing or slicing, the wafers are subjected to a grinding operation to smooth or flatten the surfaces of the wafers. However, grinding does not reduce waviness. This is due to the fact that the wafers are secured to the grinding chuck by a vacuum which temporarily flattens the aspect of the wafer during grinding, when the operation is finished and the vacuum is released, the waviness of the wafers returns. Furthermore, if the grinding conditions are not closely monitored or if the grinding mechanism is not properly cleaned prior to surface grinding, additional damage, such as bumps or "dimples" may be introduced to the surface of the wafers.

The removal of these and other surface defects created by the mechanical processing of the wafer is necessary in order to obtain a wafer which meets standard requirements for smoothness and uniform thickness (or Global Backside-referenced Indicated Range). The detection and mapping of these defects are typically achieved by means of an optical instrument or tool which measures light reflected from the wafer surface; that is, the instrument inspects the wafer surface and generates an image thereof by measuring light reflected from the wafer surface as a result of variations in surface height or slope. However, in order for such measurements to be made, the surface of the wafer must be "mirror-like."

Generally speaking, a mirror-like surface means that the wafer surface has a gloss value of at least about 250 gloss units, as determined by means common in the art (such as by a BYK Gardner Glossmeter). For purposes of comparison, it is to be noted that a wafer typically only has a gloss value of about 10 gloss units after slicing and lapping, and about 150 gloss units after grinding. As a result, in a common wafer manufacturing process, the wafer must be subjected to a time consuming and expensive mechanical or mechanochemical polishing step in order for the wafer to have a gloss value which is sufficiently high, such that it may be inspected for the presence of waviness or dimples by a instrument capable of measuring reflected light. Such instruments are generally referred to as "magic mirror"-type instruments (see, e.g., a Hologenix instrument, commercially available from Hologenix Corp.). Once a wafer has been inspected, if dimples or waviness are detected that particular wafer must be rejected. Furthermore, due to the fact that in a manufacturing environment wafers are typically processed in lots of 25 or more and that only a few representative wafers from each lot are inspected, the entire lot from which that particular wafer was selected will also be rejected.

In view of the foregoing, a need continues to exist for a process which may be utilized to yield a wafer having a gloss sufficient for optical inspection at any stage in the wafer manufacturing processing. Such a process would save time and reduce manufacturing costs because the wafer would not have to be subjected to a standard mechanical or mechanochemical polishing process prior to inspection. Such a process would also increase the gloss of a wafer without removing an excessive amount of silicon from the wafer surface. In addition, defects such as dimples and waviness could be detected much sooner in the manufacturing process, thus affording the means for early detection and correction of the source of the problem. Finally, such a process would allow wafers to be rejected in the early stages of the manufacturing, preventing defective wafers from be subjected to costly polishing and cleaning steps.

SUMMARY OF THE INVENTION

Among the objects of the present invention may be noted the provision of process for optically inspecting the surface of a silicon wafer for mechanically and mechanochemically induced defects; the provision of such a process wherein standard surface polishing processes are not required; the provision of such a process which limits the amount of silicon removed from the wafer surface; the provision of such a process which limits changes in Global Backside-referenced Indicated Range; the provision of such a process which enables inspection to be performed at any stage in the wafer manufacturing process; and, the provision of such a process which decreases overall inspection time and manufacturing costs.

Briefly, therefore, the present invention is directed to a process for inspecting a surface or edge of a silicon wafer at any stage of silicon wafer manufacturing, in order to detect mechanical and mechanochemical related defects. The process comprises treating the silicon wafer with an aqueous etch solution comprising hydrofluoric acid and an oxidizing agent, and then optically inspecting the treated wafer surface prior to said wafer being subjected to mechanical or mechanochemical polishing.

The present invention is further directed to a process for inspecting a surface of an unpolished silicon wafer at any stage of silicon wafer manufacturing, in order to detect mechanical and mechanochemical related defects. The process comprises treating the unpolished silicon wafer surface with an aqueous etch solution comprising hydrofluoric acid and an oxidizing agent, and then optically inspecting the treated surface of the unpolished wafer using an instrument capable of measuring light reflected by the treated surface.

The present invention is still further directed to a process for manufacturing a silicon wafer from a single crystal silicon ingot, wherein mechanical or mechanochemical damage resulting from the manufacturing process is detected prior the wafer being polished. The process comprises slicing the single crystal silicon ingot to obtain a silicon wafer and then treating a surface of the sliced silicon wafer with an aqueous etch solution comprising hydrofluoric acid and an oxidizing agent. The treated wafer surface is optically inspected, and then the inspected wafer is subjected to mechanical or mechanochemical polishing.

Other objects and features will be in part apparent and in part pointed out hereinafter.

DETAILED DESCRIPTION OF THE INVENTION

Figure 1:
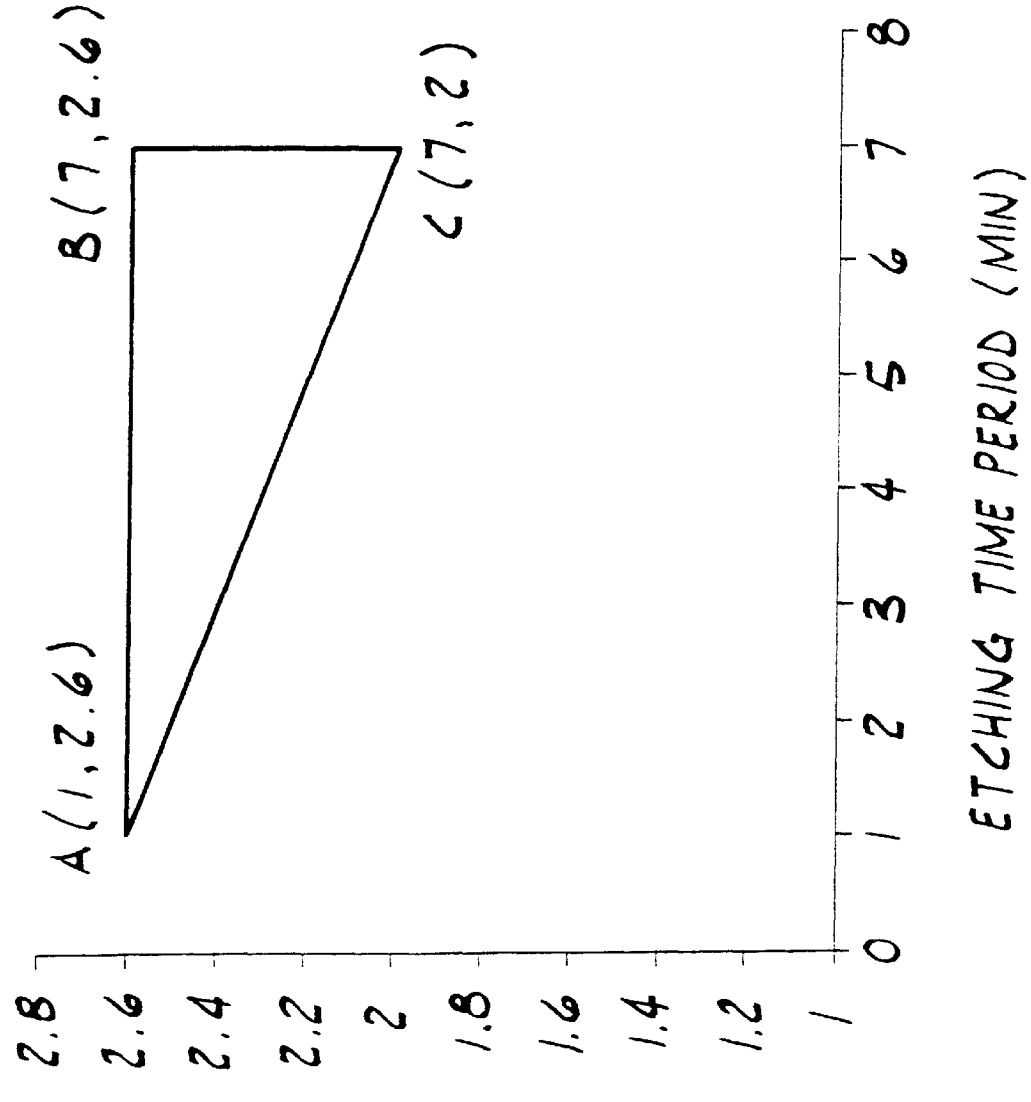
FIG. 1 a graph illustrating the relationship between etching time and etchant solution composition, for one embodiment of the process of the present invention.

Mechanical damage to the surfaces and edges of a semiconductor wafers, such as single crystal silicon wafers, typically occurs as a result of slicing, lapping and grinding, all of which are part of standard wafer manufacturing processes. In accordance with the process of the present invention, the surface and edge of the wafer may now be optically inspected after undergoing a chemical etching process, thus eliminating the need to first subject the wafer to a standard mechanical or mechanochemical polishing process in order to obtain a mirror-like surface. More specifically, in accordance with the present invention, an unpolished surface of the wafer may be treated with an aqueous etch solution comprising hydrofluoric acid (HF) and an oxidizing agent after any step in the standard wafer manufacturing process, the present process providing a wafer surface having a gloss comparable to that obtained from a standard mechanical or mechanochemical polishing process and thus being suitable for optical inspection.

The present process is particularly advantageous because only a relatively small amount of silicon is removed from the treated wafer surface. Without being held to any particular theory, it is generally believed that the limited amount of silicon removed and the high gloss of the treated surface are due to the relatively slow etch rate resulting from the less aggressive nature of the etchant as compared, for example, to nitric-acid based etchants. Accordingly, the resulting wafer may be inspected and, if acceptable, returned to the manufacturing process without concern that the wafer will be too thin for further use.

It is to be noted that, as used herein, the following phrases or terms shall have the given meanings: "mechanical damage" or "mechanochemical damage" means damage introduced to the surface of the wafer as part of the wafer manufacturing process, such as by slicing, lapping or grinding, and which occurs prior to subjecting the wafer to standard mechanical or mechanochemical polishing; "mechanical polishing" or "mechanochemical polishing" means conventional processes typically performed on a wafer to obtain a flat, mirror-like surface and which typically employ abrasives and/or alkaline conditions to remove silicon from the wafer surface; "unpolished" means a wafer which has not been subject to the aforementioned conventional polishing processes; "optical inspection" means the inspection of the wafer surface with the aid of an instrument or tool designed to measure light reflected from the wafer surface, such as, for example, a "magic mirror"-type instrument (see, e.g., a Hologenix instrument, such as model no. YIS 300 SP for 300 mm diameter wafers and YIS 2000 for 200 mm diameter wafers; commercially available from Hologenix Corp.); and, "visual inspection" means the inspection of the wafer surface under a common light source using the human eye, unaided by other instrumentation.

Generally speaking, oxidizing agents suitable for use in the present invention include nitric acid, manganese and chromium based; more specifically, suitable oxidizing agents include those capable of forming nitric acid ions ($NO_3^-$), permanganate ions ($MnO_4^-$), chromate ions ($CrO_4^{2-}$), and dichromate ions ($Cr_2O_4^{2-}$) in solution, as well chromium trioxide ($CrO_3$) and mixtures thereof. Oxidizing agents capable of forming permanganate ions in solution, such as potassium permanganate ($KMnO_4$) or sodium permanganate ($NaMnO_4$), are preferred, in part because they are less expensive and less hazardous. Furthermore, the non-nitric acid based agents are preferred due to their less aggressive nature; that is, these agents generally result in the formation of etchants which remove silicon from the wafer surface at a slower rate, thus resulting in less silicon being removed and overall providing a more uniformly flat wafer.

The aqueous etching solution of the present invention typically comprises between about 10 and about 50 weight percent hydrofluoric acid, and between about 0.2 and about 6 weight percent of an oxidizing agent. Preferably, the aqueous solution comprises between about 30 and about 40 weight percent hydrofluoric acid, and between about 1 and about 2 weight percent of an oxidizing agent. Most preferably, however, the aqueous solution comprises between about 30 and about 35 weight percent hydrofluoric acid and between about 1 and about 1.5 weight percent of an oxidizing agent. In one preferred embodiment, the aqueous solution comprises about 33 weight percent hydrofluoric acid and about 1 weight percent potassium permanganate. It is to be understood, however, that the concentration of hydrofluoric acid and the oxidizing agent in the present aqueous etching solution may be other than that herein described without departing from the scope of the present invention.

Referring now to Equations (1) and (2), the process of the present invention will be further described, wherein potassium permanganate is utilized as the oxidizing agent. Without being held to any particular theory, it is generally believed that etching proceeds with the potassium permanganate ($KMnO_4$); or rather permanganate ion ($MnO_4^-$), oxidation of silicon (Si) on the wafer surface to form silicon dioxide ($SiO_2$). The silicon dioxide is then dissolved by the hydrofluoric acid (HF).

$$12HF + 4KMnO_4 + 5Si \rightarrow 5SiO_2 + 4MnF_2 + 6H_2O + 4KF \quad (1)$$

$$SiO_2 + 6HF \rightarrow H_2SiF_6 + 2H_2O \quad (2)$$

The etchant solution of the present invention may be employed in a number of different techniques common in the art in order to etch the wafer surface. For example, one technique, referred to as spin etching, is disclosed in U.S. Pat. No. 4,903,717. The spin etching technique comprises rotating the wafer while a continuous stream of etchant is applied to the top of the wafer. Another technique is spray etching, wherein a continuous spray of etchant is applied to the wafer surface. Preferably, however, the etching technique comprises partially, and more-preferably fully, immersing the wafer into a bath of the etchant solution of the present invention. (See, e.g., U.S. Pat. No. 5,340,437.) Such an approach is preferred because the present invention is intended to provide a fast and efficient process for preparing the surface of the wafer for optical inspection.

Generally speaking, the wafer surface will be contacted or treated with the etch solution, by what ever method employed, only for a time which is sufficient to remove enough silicon from the wafer surface such that the surface is suitable for optical inspection. In addition, the precise duration of the treatment will be, at least in part, a function of the composition of the etch solution. Typically, however, the wafer surface will be contacted for about 0.4 to about 10 minutes, preferably from about 0.6 to about 8 minutes, more preferably from about 0.8 to about 6 minutes, and most preferably from about 1 to about 4 minutes.

Referring now to FIG. 1, it may be observed that as the ratio of hydrofluoric acid to oxidizing agent, such as potassium permanganate, increases, the time needed in order to effectively etch the wafer surface increases. In order to maintain the present process within a time range acceptable for purposes of obtaining an efficient and cost effective result, typically this ratio will fall somewhere within the triangular region in FIG. 1. More specifically, the volume ratio of 29 M HF solution to 1 N $KMnO_4$ solution will typically fall somewhere between about 3:1 and about 1.5:1, and preferably between about 2.5:1 and about 2:1.

Figure 2:
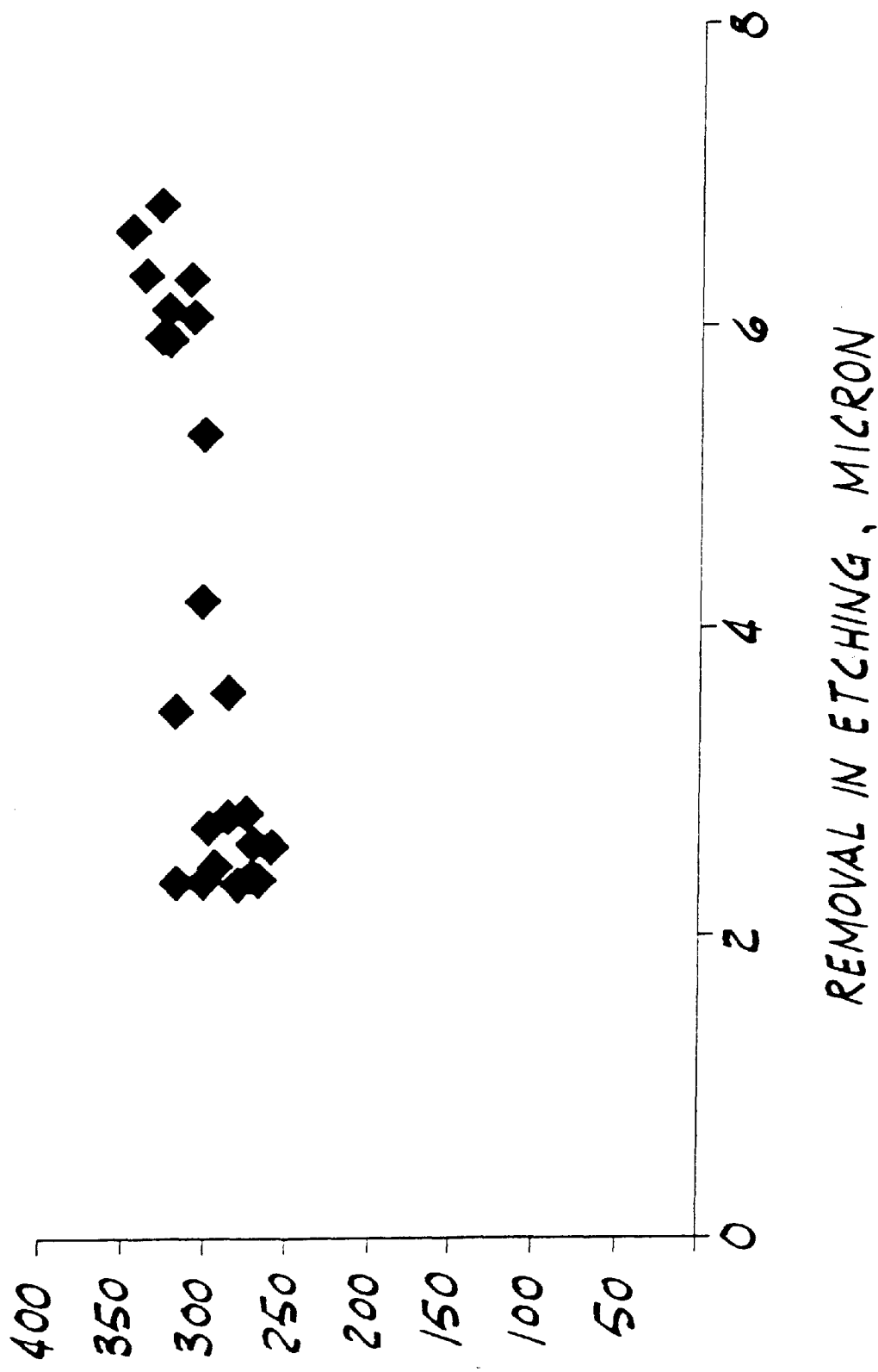
FIG. 2 is a graph illustrating the relationship between the etching time and the surface gloss of wafers prepared in accordance with the present invention.
Figure 3:
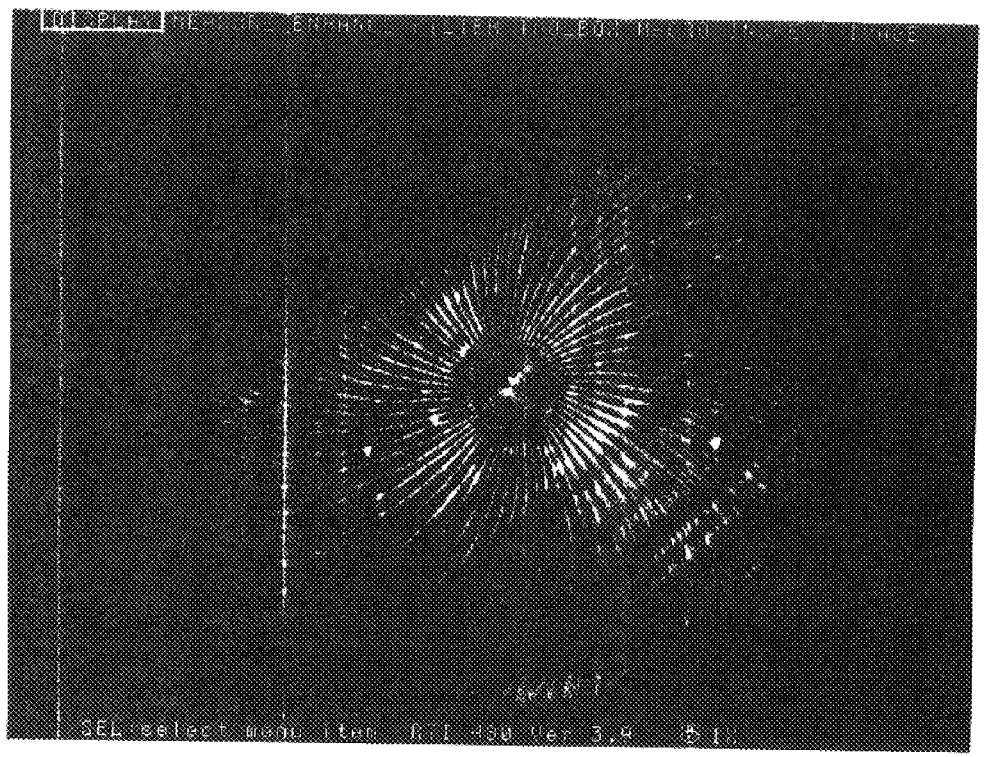
FIG. 3–13 are photographs of maps or images, produced by a Hologenix instrument, of wafers etched according the present invention for varying amounts of time following the standard slicing and grinding steps of a wafer manufacturing process.
Figure 4:
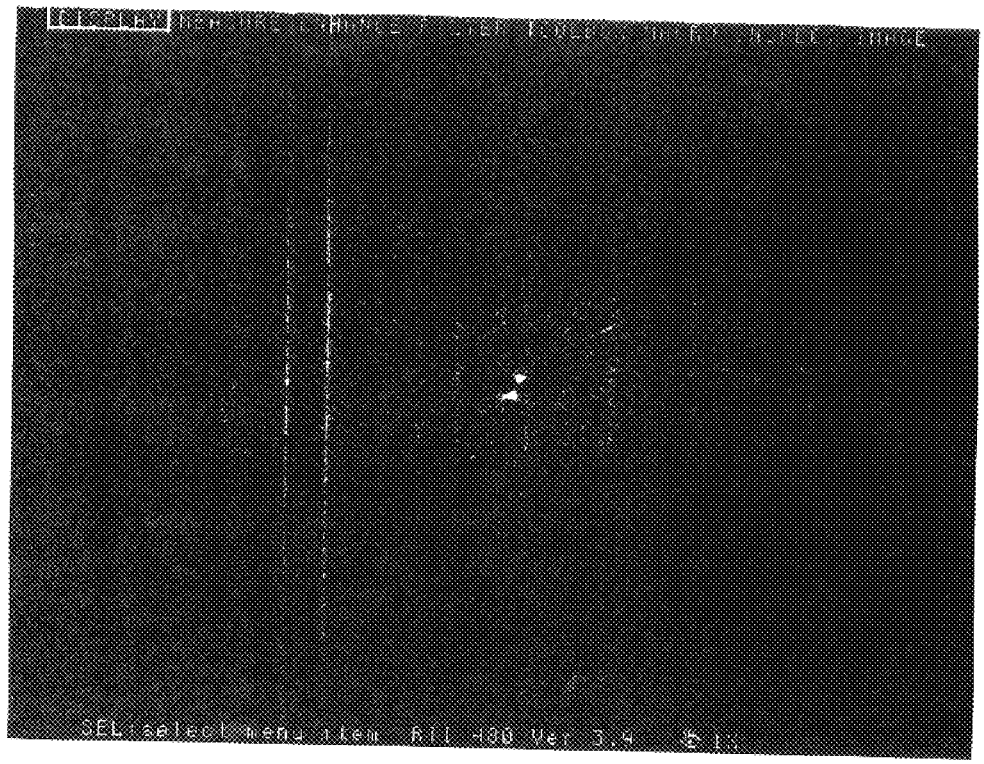
Figure 5:
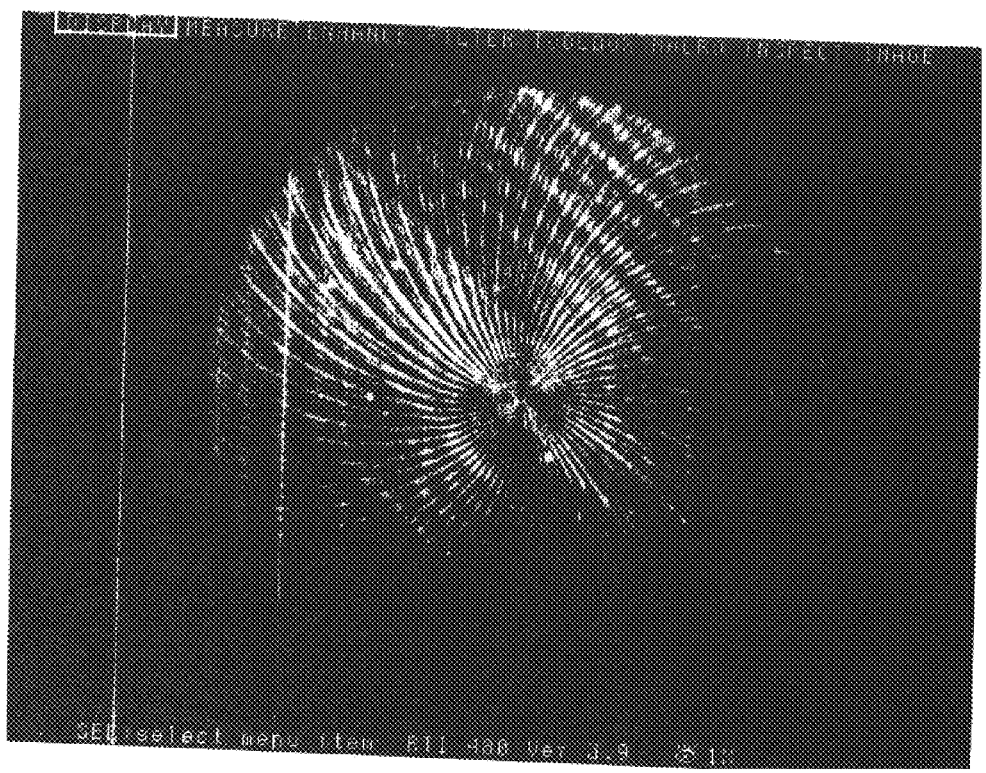
Figure 6:
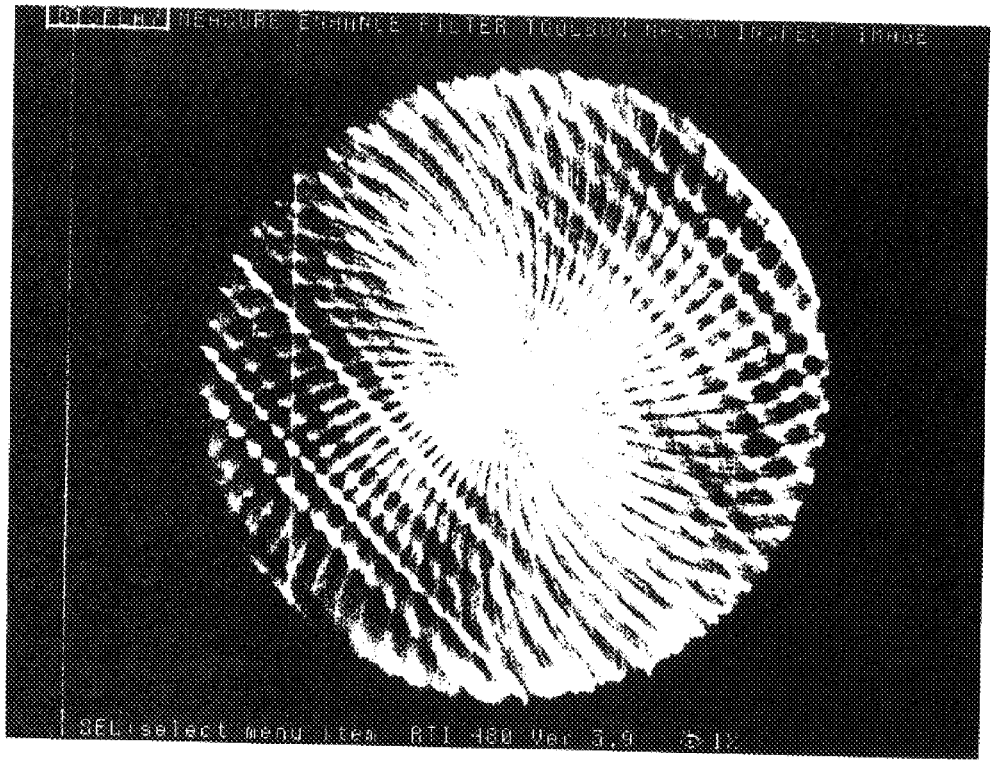
Figure 7:
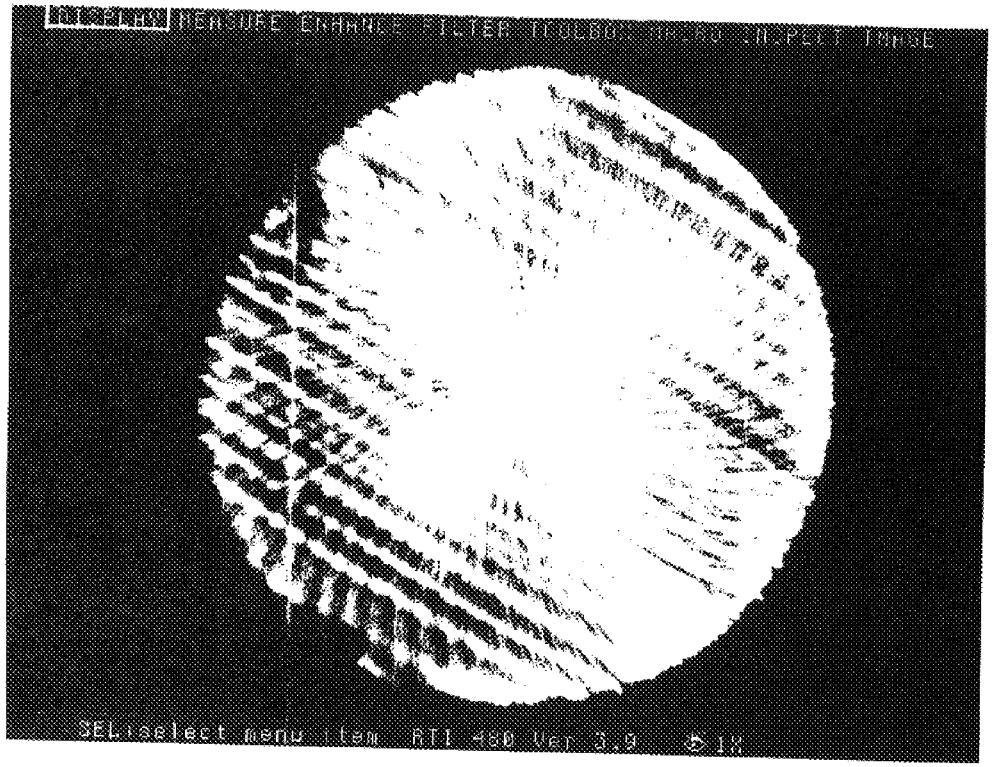
Figure 8:
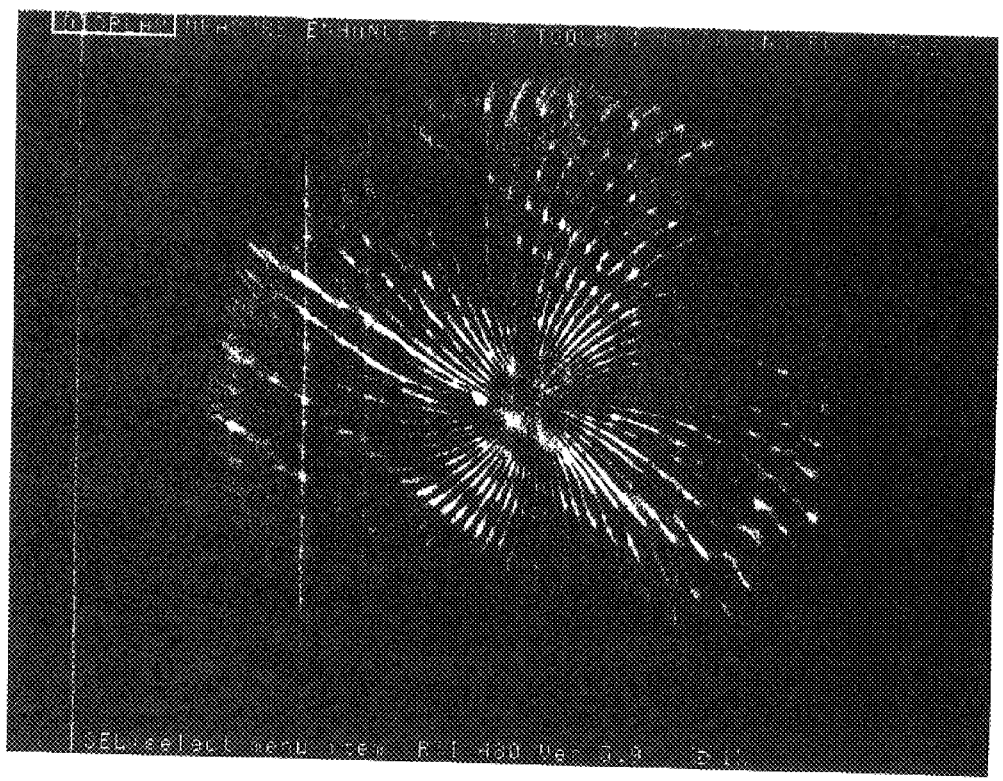
Figure 9:
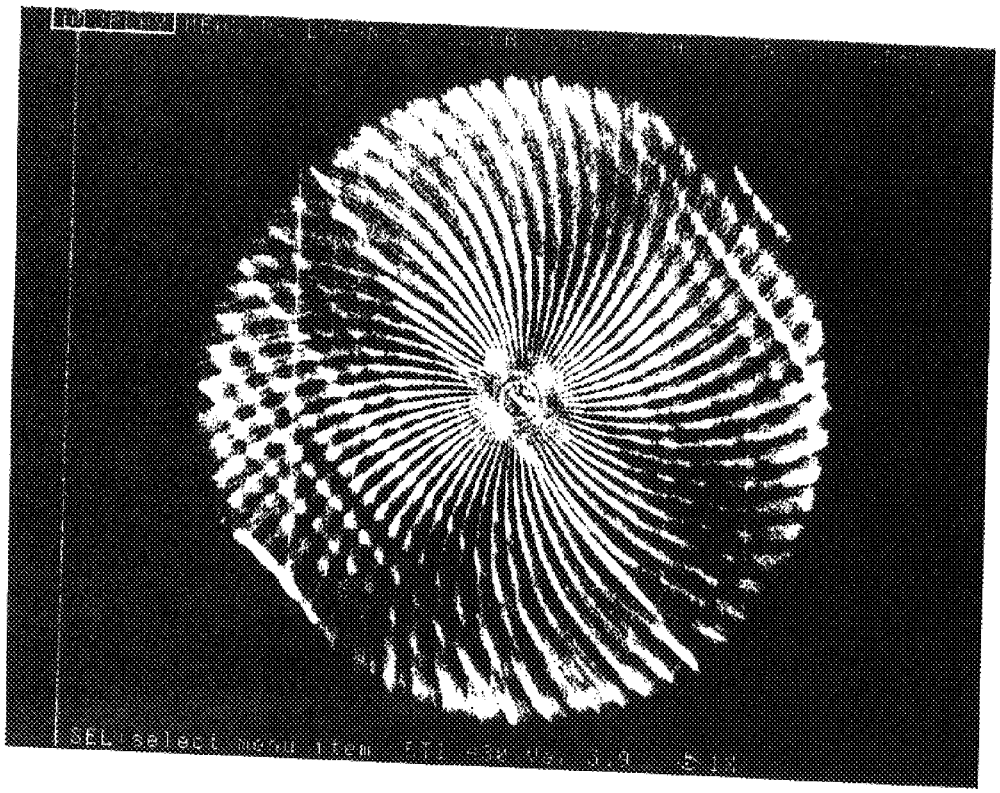
Figure 10:
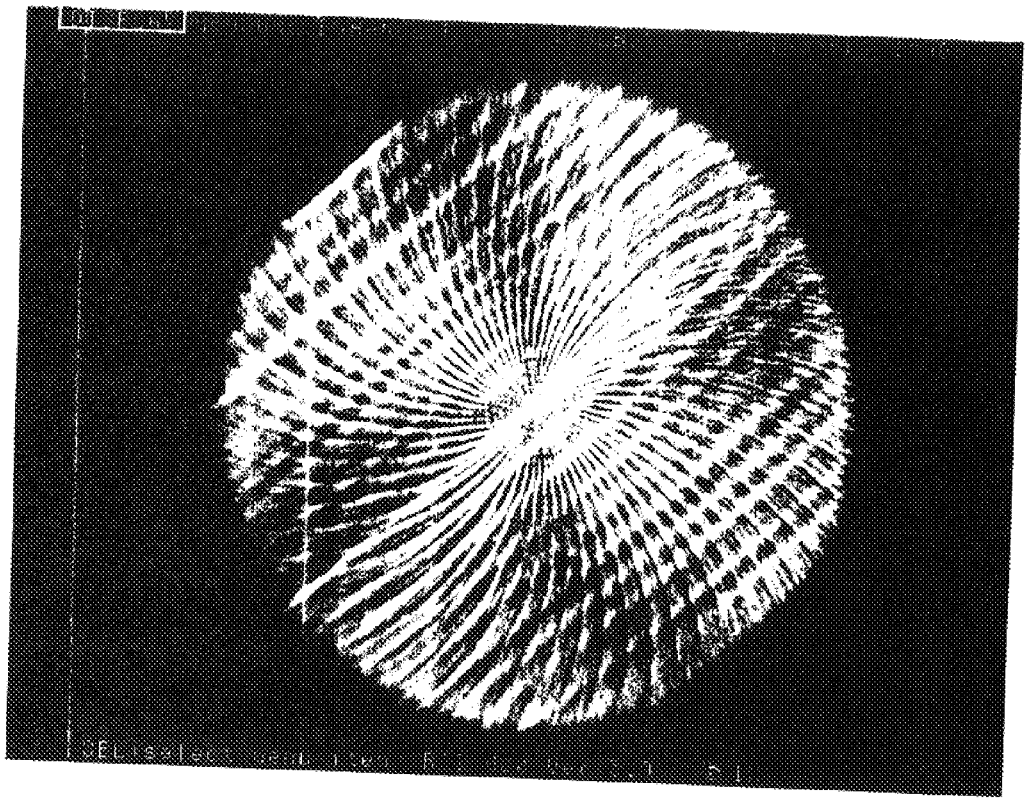
Figure 11:
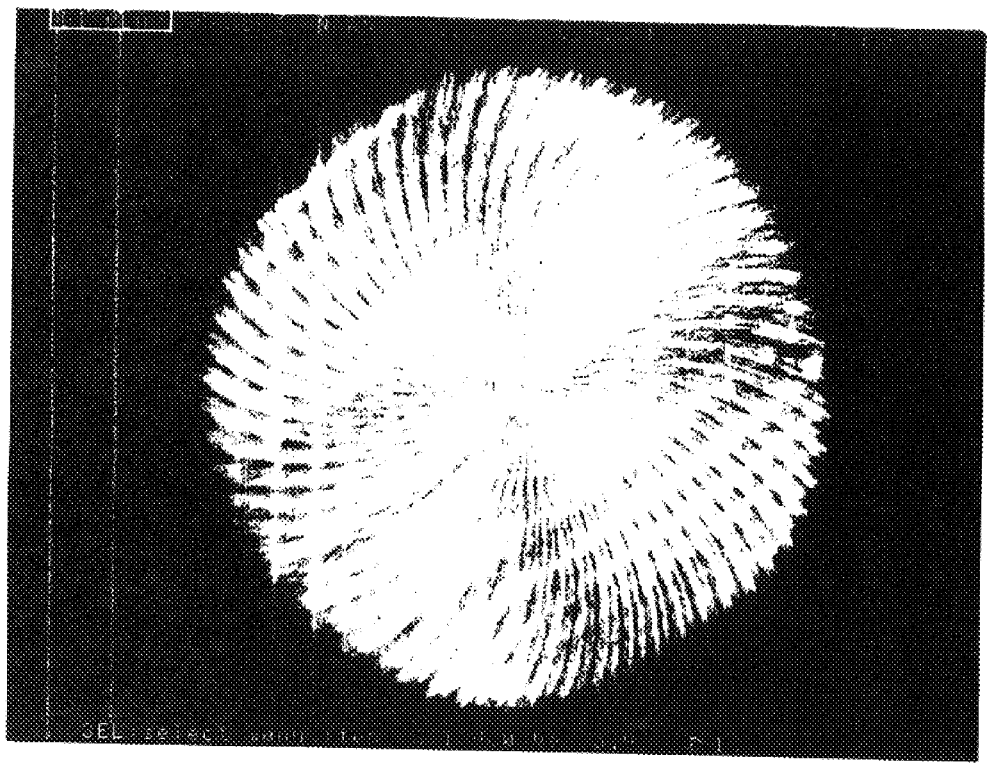
Figure 12:
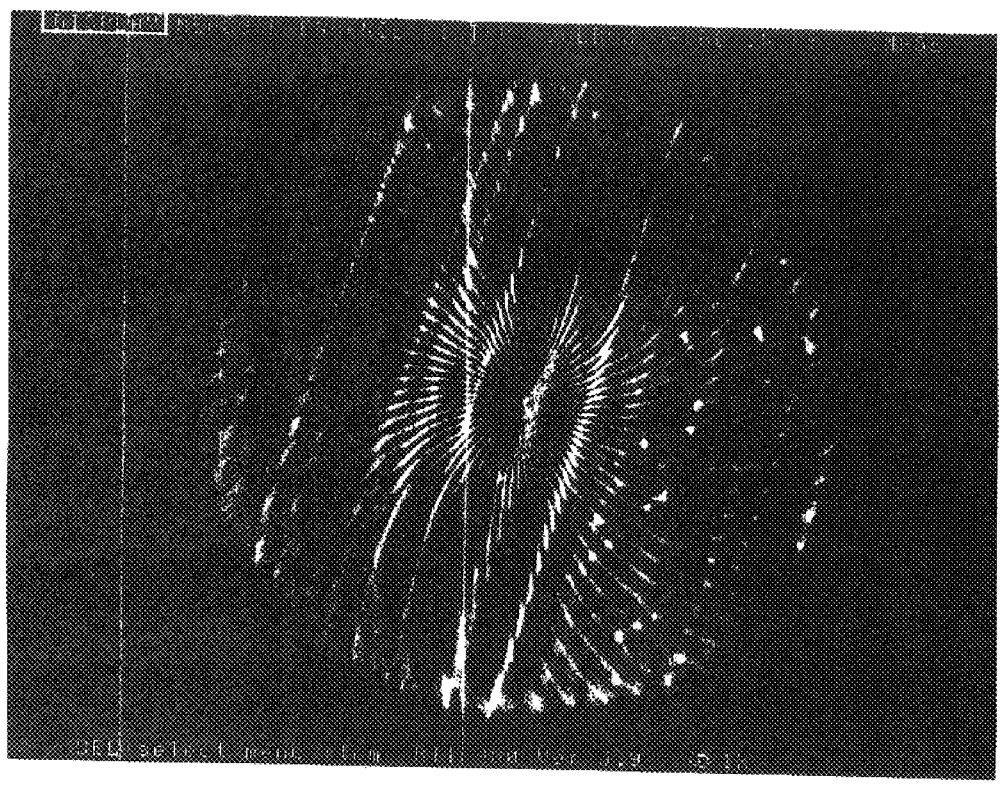
Figure 13:
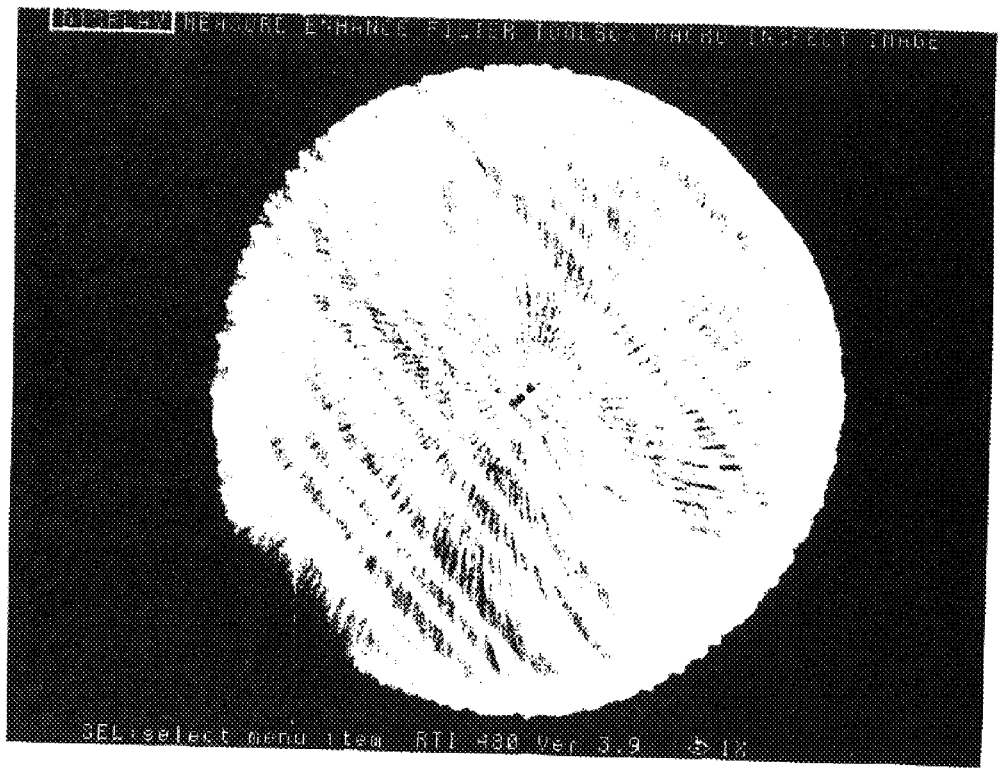

Referring now to FIG. 2, the process of the present invention is capable of etching the surface of a unpolished wafer to yield a surface having a gloss which is sufficient for optical inspection. Typically, the gloss of the wafer surface will be at least about 250 gloss units, with a gloss of at least about 300, 350, 400 gloss units or more being preferred. More particularly, it is to be noted from FIG. 2 that such gloss values may be achieved by removing a relatively small amount of silicon from the wafer surface. For example, in contrast to standard polishing processes which result in the removal of at least about 10–15 $\mu m$ of silicon or more from the wafer surface, experimental evidence to-date suggests that a suitable surface may be obtained using the etchant of the present invention by typically removing less than about 10 $\mu m$ of silicon from the wafer surface. Preferably, however, about 2 $\mu m$ to about 8 $\mu m$ of silicon will be remove, while in some instances about 4 $\mu m$ to about 6 $\mu m$ may be even more preferred.

In view of the foregoing, it is to be noted that the present process is advantageous because a minimal amount of silicon may be removed from the surface while still obtaining a surface suitable for optical inspection. As previously noted, minimizing the amount of silicon removed acts to minimize the effects etching has on wafer flatness; that is, as more silicon is removed, the negative impact on wafer flatness increases. Furthermore, the in view of the amount of silicon removed from the wafer surface, the present process provides the means by which to repeatedly inspect the wafer without causing the wafer to become too thin for further processing.

To ensure uniform etching of the wafer surface, the etchant solution may be continuously mixed or agitated for the duration of the process. Bath agitation or mixing may be achieved by means known in the art, such as by employing ultrasonic agitation, stirring devices, pumps or by "bubbling" a gas through the etchant solution (see, e.g., U.S. Pat. No. 5,340,437). However, it is to be noted that, given the short period during which the wafer will be treated with the solution, agitation is generally not necessary.

In addition to the gas bubbles which may be introduced into the etchant solution as a result of gas agitation, gas bubbles may also be formed via the etching reaction itself. More specifically, as the etchants of the present process react with the wafer surface, hydrogen gas evolves, creating hydrogen bubbles in the etching bath. These bubbles tend to adhere to the wafer surface and may interfere with the action of the etchant, resulting in nonuniform etching and possibly surface staining. (See, e.g., M. S. Kulkarni and E. F. Erk, "Wet Etching of Silicon Wafers: Transport and Kinetic Effects," Paper 124f, AIChE Conference, Los Angeles (1997).)

The effects of these bubbles can be minimized, however, by the addition of a surfactant to the etchant solution. Without being held to any particular theory, it is generally believed that the surfactant acts as a wetting agent, reducing the surface tension of the aqueous solution on the surface of the wafer and thus preventing the gas bubbles from adhering thereto. Furthermore, it is believed that the surfactant stabilizes the size of the bubbles in the bath, which also helps to produce more consistent etching results.

Any surfactant that is stable in the presence of the oxidizing agent of this invention can be added to the etching solution. For example, a potassium fluoroalkyl carboxylate surfactant sold under the trade designation FC-129 (commercially available from 3M Corporation; St. Paul, Minn.), or sodium dodecyl sulfate can be added to the etchant solution. Experience to-date, however, suggests that a smoother, more uniformly etched surface may be obtained if fluoroalkyl sulfonate surfactants, such as ammonium perfluoroalkyl sulfonate and potassium perfluoroalkyl sulfonate (sold under the respective trade designations FC-93 and FC-95; commercially available from 3M Corporation; St. Paul, Minn.) are added to the solution.

When added to the etching solution, typically a quantity of surfactant will be used which is sufficient to prevent the adherence of gas bubbles on the surfaces of the wafer. The precise amount needed for a given set of process conditions and etchant solution may be determined, for example, empirically by etching a wafer and then inspecting the wafer surface for the presence of imprints left by bubbles. Such imprints may be detected by means common in the art such as, for example, Nomarksi imaging.

Typically, however, the aqueous etch solution comprises about 0.05 to about 1 weight percent of the surfactant. Preferably, the etch solution comprises about 0.1 to about 0.5 weight percent, and more preferably from about 0.15 to about 0.25 weight percent of the surfactant. In one preferred embodiment, the aqueous etch solution comprises about 0.2 weight percent of a fluoroalkyl sulfonate surfactant. It is to be understood, however, that the concentration of surfactant in the present aqueous etching solution may be other than that herein described without departing from the scope of the present invention.

The process of the present invention is typically performed at room temperature (i.e., about 20° C. to about 25° C.); that is, typically the etching process of the present invention is carried out at room temperature and without the application of heat. Although temperatures in the range of about 25° C. to about 45° C. may be employed, it is to be noted that experience to-date suggests temperature generally does not plays a significant role in the present etching process.

Following the etching process of the present invention, the sample wafer is optically inspected in order to detect surface damage resulting from mechanical or mechanochemical operations common to wafer manufacturing processes, such as slicing, lapping and grinding; that is, the wafer is optically inspected to detect damage commonly resulting from operations performed on the wafer as part of the manufacturing process, prior to being subjected to a standard mechanical or mechanochemical polishing process. Optical inspection is performed by means of a "magic mirror"-type of instrument which measures light reflected from the wafer surface as a result of variations in slope or height in different regions of the surface, these variations being caused by surface irregularities such as waviness or dimples.

If the wafer surface is determined to be within set tolerance limits, the wafer passes inspection and is reintroduced into the manufacturing process. However, if unacceptable imperfections are detected on the surface, all wafers subjected to similar manufacturing conditions are removed from the manufacturing process. Specifically, if an unacceptable level of waviness is detected, all the wafers sliced from the same ingot as the sample wafer are removed from the manufacturing process. Likewise, if an unacceptable number of dimples or dimples of unacceptable size are detected, all the wafers lapped/ground under similar conditions as the sample wafer are removed from the manufacturing process. Lastly, feedback will be directed to the problematic manufacturing operation so that appropriate adjustments may be made.

The process of the present invention may typically be performed on any wafer surface in order to obtain a wafer surface suitable for optical inspection. However, the present process is particularly suited for preparing the surface of a wafer for pre-polish inspection; that is, the present process is particular suited for inspecting a wafer which has not been subjected to a standard mechanical or mechanochemical polishing process. Accordingly, wafers to be treated by the present invention will typically have a surface gloss value which is less than that of wafers subjected to such standard polishing processes, the standard polishing processes typically yielding wafers having gloss values ranging from about 370–380 gloss units. More specifically, unpolished wafers subjected to the present process will typically have gloss values of less than about 300, and even less than about 250, gloss units. Thus, the present process is a suitable alternative to standard polishing techniques for purpose of preparing a wafer surface for optical inspection to detect, for example, waviness and dimples.

The present invention is further illustrated by the following Example. It is presented merely for the purpose of illustration and is not to be regarded as limiting the scope of the invention or manner in which it may be practiced.

EXAMPLE

A number of 300 mm diameter unpolished wafers were subjected to the present process. More specifically, a number of 300 mm wafers were ground by means common in the art and then, after the initial thickness of each was determined, subjected to the etching process, wherein each wafer was treated with an aqueous etching solution comprising a 33 weight percent hydrofluoric acid, 1 weight percent potassium permanganate and 0.2 weight percent potassium fluoroalkyl sulfonate surfactant.

The amount of time each wafer was immersed in the etchant was varied between about 1 minute and about 4 minutes in order to vary the amount of silicon removed from the treated surface. After each wafer was etched, rinsed and dried, the thickness was again measure and then the wafer was optically inspected using a Hologenix instrument (model no. YIS 300 SP, commercially available from Hologenix Corp.). The results of the experiment are presented in Table 1, below, and FIGS. 3–13.

TABLE 1

| Figure # | Mechanical Defects Detected | Silicon Removed ($\mu$m) | Time (min) | Roughness ($\mu$m) | Gloss |
|---|---|---|---|---|---|
| 3 | waviness; dimples | 2.36 | 1 | 0.032 | 318 |
| 4 | waviness; no dimples | 2.37 | 1 | 0.034 | 301 |
| 5 | waviness; dimples | 2.78 | 1 | 0.038 | 289 |
| 6 | waviness; no dimples | 3.50 | 2 | 0.026 | 320 |
| 7 | waviness; faint dimples | 4.20 | 2 | 0.04 | 304 |
| 8 | waviness; dimples | 5.31 | 2 | 0.04 | 304 |
| 9 | waviness; no dimples | 5.93 | 3 | 0.03 | 325 |
| 10 | waviness; no dimples | 5.95 | 3 | 0.038 | 332 |
| 11 | waviness; no dimples | 6.08 | 3 | 0.032 | 310 |
| 12 | waviness; dimples | 6.33 | 4 | 0.036 | 313 |
| 13 | waviness; no dimples | 6.36 | 4 | 0.028 | 340 |

As can generally be seen from the Figures and the data presented, if dimples or waviness are present on the wafer surface, these defects may be observed after as little as about 2 $\mu$m of silicon are removed; that is, a surface suitable for optical inspection may be obtained after as little as about 2 $\mu$m of silicon are removed. The above data further indicates that a surface acceptable for optical inspection can be obtained in as little as about 1 minute.

In contrast to the present invention, standard polishing processes typically remove at least 10–15 $\mu$m of silicon or more from the wafer surface, and requires about 65 to about 70 minutes to complete. Accordingly, the present process is a more efficient means by which to obtain a wafer surface suitable for optical inspection.

The process of the present invention is also an improvement over standard wafer etching processes utilizing nitric acid-based etchants because such etchants also typically remove at least 10–15 $\mu$m of silicon or more from the wafer surface and require 5 to 10 minutes or more to be completed. The present process therefore removes less silicon from the wafer surface and requires less time, thereby reducing process time and increasing the efficiency of the inspection and manufacturing processes.

In view of the above, it will be seen that the several objects of the invention are achieved and other advantageous results attained. As various changes could be.made in the above compositions and processes without departing from the scope of the invention, it is intended that all matter contained in the above description be interpreted as illustrative and not in a limiting sense.

What is claimed is:

1. A process for inspecting a surface or edge of an unpolished silicon wafer in order to detect mechanical and mechanochemical related defects, the process comprising:
   treating the unpolished silicon wafer with an aqueous etch solution comprising hydrofluoric acid and an oxidizing agent that forms permanganate ions in the aqueous etch solution to increase the gloss of the unpolished silicon wafer; and,
   optically inspecting the treated unpolished silicon wafer surface or edge prior to said unpolished silicon wafer being subjected to mechanical or mechanochemical polishing.

2. The process as set forth in claim 1 wherein the wafer, prior to treatment, has a gloss value of less than about 250 gloss units.

3. The process as set forth in claim 1 wherein the treated wafer surface has a gloss of at least about 300 gloss units.

4. The process as set forth in claim 1 wherein the unpolished silicon wafer surface is treated with the aqueous etch solution for about 1 minutes to about 4 minutes.

5. The process as set forth in claim 1 wherein the aqueous etch solution comprises about 10 to about 50 weight percent hydrofluoric acid.

6. The process as set forth in claim 1 wherein the oxidizing agent is potassium permanganate or sodium permanganate.

7. The process as set forth in claim 1 wherein the aqueous etch solution comprises about 0.2 to about 6 weight percent of the oxidizing agent.

8. The process as set forth in claim 1 wherein the aqueous etch solution additionally comprises about 0.1 to about 2 weight percent of a surfactant.

9. The process as set forth in claim 8 wherein the surfactant is ammonium perfluoroalkyl sulfonate or potassium perfluoroalkyl sulfonate.

10. The process as set forth in claim 1 wherein the unpolished silicon wafer surface is treated to remove less than about 10 m of silicon from the surface.

11. A process for inspecting a surface of an unpolished silicon wafer in order to detect mechanical and mechanochemical related defects, the process comprising:

treating the unpolished silicon wafer surface with an aqueous etch solution comprising hydrofluoric acid and an oxidizing agent that forms permanganate ions in the aqueous etch solution to increase the gloss of the unpolished silicon wafer; and, optically inspecting the treated surface of the unpolished wafer using an instrument capable of measuring light reflected by the treated surface.

12. The process as set forth in claim 11 wherein the unpolished wafer surface is treated to remove about 2 $\mu$m to about 8 $\mu$m of silicon.

13. The process as set forth in claim 11 wherein the unpolished wafer, prior to treatment, has a surface gloss value of less than 250 gloss units.

14. The process as set forth in claim 11 wherein the treated surface of the unpolished wafer has a gloss of at least about 300 gloss units.

15. The process as set forth in claim 11 wherein the unpolished wafer surface is treated with the aqueous etch solution for about 1 minutes to about 4 minutes.

16. The process as set forth in claim 11 wherein the aqueous etch solution comprises about 10 to about 50 weight percent hydrofluoric acid.

17. The process as set forth in claim 11 wherein the oxidizing agent is potassium permanganate or sodium permanganate.

18. The process as set forth in claim 11 wherein the aqueous etch solution comprises about 0.2 to about 6 weight percent of the oxidizing agent.

19. The process as set forth in claim 11 wherein the aqueous etch solution additionally comprises about 0.1 to about 2 weight percent of a surfactant.

20. The process as set forth in claim 19 wherein the surfactant is ammonium perfluoroalkyl sulfonate or potassium perfluoroalkyl sulfonate.

21. A process for manufacturing a silicon wafer from a single crystal silicon ingot, wherein mechanical or mechanochemical damage resulting from the manufacturing process is detected prior the wafer being polished, the process comprising:

slicing the single crystal silicon ingot to obtain an unpolished silicon wafer;

treating a surface of the unpolished silicon wafer with an aqueous etch solution comprising hydrofluoric acid and an oxidizing agent that forms permanganate ions in the aqueous etch solution to increase the gloss of the unpolished silicon wafer;

optically inspecting the treated unpolished silicon wafer surface; and, subjecting the inspected unpolished silicon wafer to mechanical or mechanochemical polishing.

22. The process as set forth in claim 21 wherein a surface of the unpolished silicon wafer is ground prior to being treated with the aqueous etch solution.

23. A process for inspecting a surface or edge of a silicon wafer in order to detect mechanical and mechanochemical related defects, the process comprising:

selecting a wafer having a gloss value of less than 250 gloss units;

treating the silicon wafer with an aqueous etch solution comprising hydrofluoric acid and an oxidizing agent that forms permanganate ions in the aqueous etch solution to increase the gloss of the silicon wafer to a gloss value of at least about 250 gloss units; and, optically inspecting the treated silicon wafer surface or edge.

24. The process as set forth in claim 23 wherein the gloss of the treated wafer is increased to a gloss value of at least about 300 gloss units.

* * * * *

UNITED STATES PATENT AND TRADEMARK OFFICE
CERTIFICATE OF CORRECTION

PATENT NO.   : 6,600,557 B1　　　　　　　　　　　　　　　　　　　　　　　Page 1 of 1
DATED        : July 29, 2003
INVENTOR(S)  : Anca Stefanescu et al.

It is certified that error appears in the above-identified patent and that said Letters Patent is hereby corrected as shown below:

Column 9,
Line 26, "10 m" should read -- 10 $\mu$m --.

Column 10,
Line 17, "prior the wafer" should read -- prior to the wafer --.

Signed and Sealed this

Fourth Day of November, 2003

JAMES E. ROGAN
*Director of the United States Patent and Trademark Office*